(12) United States Patent
Newman

(10) Patent No.: US 11,923,217 B2
(45) Date of Patent: *Mar. 5, 2024

(54) PROCESSING SYSTEM HAVING A FRONT OPENING UNIFIED POD (FOUP) LOAD LOCK

(71) Applicant: Applied Materials, Inc., Santa Clara, CA (US)

(72) Inventor: Jacob Newman, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/857,749

(22) Filed: Jul. 5, 2022

(65) Prior Publication Data
US 2022/0406630 A1 Dec. 22, 2022

Related U.S. Application Data

(63) Continuation of application No. 16/545,749, filed on Aug. 20, 2019, now Pat. No. 11,380,564.

(60) Provisional application No. 62/733,563, filed on Sep. 19, 2018.

(51) Int. Cl.
  *B65G 47/91* (2006.01)
  *H01L 21/67* (2006.01)
  *H01L 21/677* (2006.01)

(52) U.S. Cl.
  CPC ........ *H01L 21/67201* (2013.01); *B65G 47/91* (2013.01); *H01L 21/67017* (2013.01); *H01L 21/67126* (2013.01); *H01L 21/67196* (2013.01); *H01L 21/67733* (2013.01); *H01L 21/67754* (2013.01); *H01L 21/67757* (2013.01); *H01L 21/67772* (2013.01); *H01L 21/67781* (2013.01)

(58) Field of Classification Search
  CPC ......... H01L 21/67201; H01L 21/67017; H01L 21/67126; H01L 21/67196; H01L 21/67733; H01L 21/67754; H01L 21/67757; H01L 21/67772; H01L 21/67781; B65G 47/91
  See application file for complete search history.

(56) References Cited

U.S. PATENT DOCUMENTS

| | | | | |
|---|---|---|---|---|
| 10,928,798 B2 * | 2/2021 | Aizawa | ............... | G05B 19/188 |
| 11,171,028 B2 * | 11/2021 | Pannese | ........... | H01L 21/68707 |
| 11,194,259 B2 * | 12/2021 | Chiu | .................. | G03F 7/70725 |
| 11,227,782 B2 * | 1/2022 | de Ridder | ......... | H01L 21/67769 |

(Continued)

*Primary Examiner* — Saul Rodriguez
*Assistant Examiner* — Ashley K Romano
(74) *Attorney, Agent, or Firm* — Patterson + Sheridan, LLP

(57) ABSTRACT

An embodiment is a processing system for processing a substrate. The processing system includes a Front Opening Unified Pod (FOUP) load lock (FLL) and a vacuum system. The FLL has walls defining an interior space therein. The FLL includes load lock isolation and tunnel isolation doors. The load lock isolation door is operable to close a first opening in a first sidewall of the FLL. The first opening is sized so that a FOUP is capable of passing therethrough. The tunnel isolation door is operable to close a second opening in a second sidewall of the FLL. The second opening is sized so that a substrate is capable of passing therethrough. The vacuum system is fluidly connected to the interior space of the FLL and is operable to pump down a pressure of the interior space of the FLL.

20 Claims, 12 Drawing Sheets

(56) References Cited

U.S. PATENT DOCUMENTS

| | | |
|---|---|---|
| 11,380,564 B2 | 7/2022 | Newman |
| 11,404,291 B2 * | 8/2022 | Hirotani ............ H01L 21/67017 |
| 11,515,187 B2 * | 11/2022 | Oosterlaken ........ H01L 21/6773 |
| 2007/0051312 A1 | 3/2007 | Sneh |
| 2007/0107598 A1 | 5/2007 | Lee |
| 2009/0003976 A1 | 1/2009 | Hofmeister |
| 2010/0202093 A1 | 8/2010 | Yamawaku |
| 2011/0245957 A1 | 10/2011 | Porthouse et al. |
| 2014/0126980 A1 | 5/2014 | Wamura |
| 2014/0202921 A1 | 7/2014 | Babbs |
| 2015/0039116 A1 | 2/2015 | Yamamoto |
| 2017/0025290 A1 | 1/2017 | Wakabayashi |
| 2017/0218513 A1 | 8/2017 | Nakada |
| 2018/0258533 A1 | 9/2018 | Liang et al. |
| 2019/0148178 A1 | 5/2019 | Liang et al. |
| 2019/0152722 A1 | 5/2019 | Wakabayashi |
| 2020/0194296 A1 | 6/2020 | Numakura |
| 2020/0365405 A1 | 11/2020 | Zucker |

* cited by examiner

PROCESSING SYSTEM HAVING A FRONT OPENING UNIFIED POD (FOUP) LOAD LOCK

CROSS-REFERENCE TO RELATED APPLICATIONS

This application is a continuation of U.S. Non-Provisional application Ser. No. 16/545,749, filed on Aug. 20, 2019, which claims benefit of U.S. Provisional Patent Application No. 62/733,563, filed on Sep. 19, 2018, each of which are incorporated herein by reference in its entirety.

BACKGROUND

Field

The present disclosure generally relates to a processing system for processing a semiconductor substrate, and more particularly, to a processing system having a Front Opening Unified Pod (FOUP) load lock.

Description of the Related Art

Forming an integrated circuit on a semiconductor substrate (e.g., wafer) generally includes numerous different processes. Each of these processes can be performed by a processing system (e.g., a tool) that has one or more processing chambers. These various processing systems are usually housed in a fabrication plant or facility (e.g., a "fab"). The substrates can be transported between different processing systems using a Front Opening Unified Pod (FOUP).

Cleanliness of the processing systems in the fab and of the substrates processed by the processing systems may affect performance of the resulting integrated circuit. A particle of dust or other debris in a processing system can prevent proper processing of the substrates. Fabs are generally designed to ensure a proper level of cleanliness (e.g., Class 1 cleanroom standard, etc.). However, particles may still be introduced to the fab. Hence, an opening at an interface between a processing system and the ambient environment of the fab can introduce particles into the processing system.

SUMMARY OF THE DISCLOSURE

An embodiment is a processing system for processing a substrate. The processing system includes a Front Opening Unified Pod (FOUP) load lock and a vacuum system. The FOUP load lock has walls defining an interior space therein. The FOUP load lock includes a load lock isolation door and a tunnel isolation door. The load lock isolation door is operable to close a load lock isolation door opening in a first sidewall of the FOUP load lock. The load lock isolation door opening is sized so that a FOUP is capable of passing therethrough to and from the interior space. The tunnel isolation door is operable to close a first slit valve opening in a second sidewall of the FOUP load lock. The first slit valve opening is sized so that a substrate capable of being placed in the FOUP is capable of passing through the first slit valve opening to and from the interior space. The vacuum system is fluidly connected to the interior space of the FOUP load lock. The vacuum system is operable to pump down a pressure of the interior space of the FOUP load lock.

Another embodiment is a method for providing a substrate to a processing system. A first Front Opening Unified Pod (FOUP) is positioned at a load lock door opening of a FOUP load lock. Using a shuttle, the first FOUP is transferred through the load lock door opening to an interior space of the FOUP load lock. After transferring the first FOUP to the interior space, a pressure of the interior space is pumped down. Using the shuttle, the first FOUP is positioned at a slit valve opening of the FOUP load lock.

A yet further embodiment is a processing system for processing a substrate. The processing system includes a Front Opening Unified Pod (FOUP) load lock, a vacuum system, a transfer chamber, and a processing chamber. The FOUP load lock is configured to receive a FOUP in an interior space of the FOUP load lock. The vacuum system is fluidly connected to the interior space of the FOUP load lock. The vacuum system is operable to pump down a pressure of the interior space of the FOUP load lock. The transfer chamber is attached to the FOUP load lock. The transfer chamber comprises a transfer robot. The transfer robot is operable to transfer a substrate from the FOUP in the interior space to the transfer chamber. The processing chamber is attached to the transfer chamber. The transfer robot is operable to transfer a substrate from the transfer chamber to the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only some example embodiments of this disclosure and are therefore not to be considered limiting of its scope, for the disclosure may admit to other equally effective embodiments.

To facilitate understanding, identical reference numerals have been used, wherever possible, to designate identical elements that are common to the figures. It is contemplated that aspects of one embodiment may be used in other embodiments, without further recitation.

DETAILED DESCRIPTION

Examples described herein related to a Front Opening Unified Pod (FOUP) load lock that can be incorporated into a processing system. The FOUP load lock includes a shuttle that can transfer a FOUP into and out of an interior space of the FOUP load lock. The FOUP load lock can have FOUP door opening capabilities and can have substrate mapping capabilities. The shuttle can index the FOUP so that a transfer robot can directly access semiconductor substrates (e.g., wafers) in the FOUP. The FOUP load lock can include a FOUP transfer and queueing elevator system, which can function as an interface between the FOUP load lock and an overhead hoist transfer (OHT) system. If implemented, the FOUP transfer and queueing elevator system can stage an additional FOUP while substrates from another FOUP in the FOUP load lock are being processed by the processing system. This staging can reduce down time of the processing system. Among other possible benefits, the FOUP load lock can eliminate or obviate some components of previous systems, and can reduce a footprint and cost of the processing system.

Various aspects of different examples are described below. Although multiples aspects of different examples may be described together in a process flow, the multiple aspects can each be implemented separately or individually and/or in a different process flow. Additionally, various process flows are described as being performed in an order; other examples can implement process flows in different orders and/or with more or fewer operations.

A FOUP, as implemented in the examples described below, can have different constructions. For example, a FOUP can have or be a plastic enclosure. A FOUP with a plastic enclosure may be vented so that a pressure inside the FOUP is the same as the pressure of the ambient environment of the FOUP. In other examples, a FOUP can have or be an enclosure formed of a metal or other rigid material with sufficient strength to maintain the structural integrity of the FOUP when a vacuum is applied within the FOUP and the ambient environment is, e.g., one atmosphere (atm). In examples where the FOUP implements an enclosure formed of a metal or other rigid material, the FOUP may be maintained outside of a processing system (e.g., during transport between processing systems) in a vacuum or reduced pressure state, which can reduce the likelihood of an incidence of dust or other particles in the FOUP. In further examples, a FOUP can have or be an enclosure formed of a metal or other rigid material, which is vented. A FOUP can have one or more slots (e.g., 25 slots) each for placing a semiconductor substrate (e.g., wafer), such as for storage and transport. The FOUP can accommodate any size of substrate, such as a 200 mm diameter substrate, 300 mm diameter substrate, or a 450 mm diameter substrate.

Figure 1:
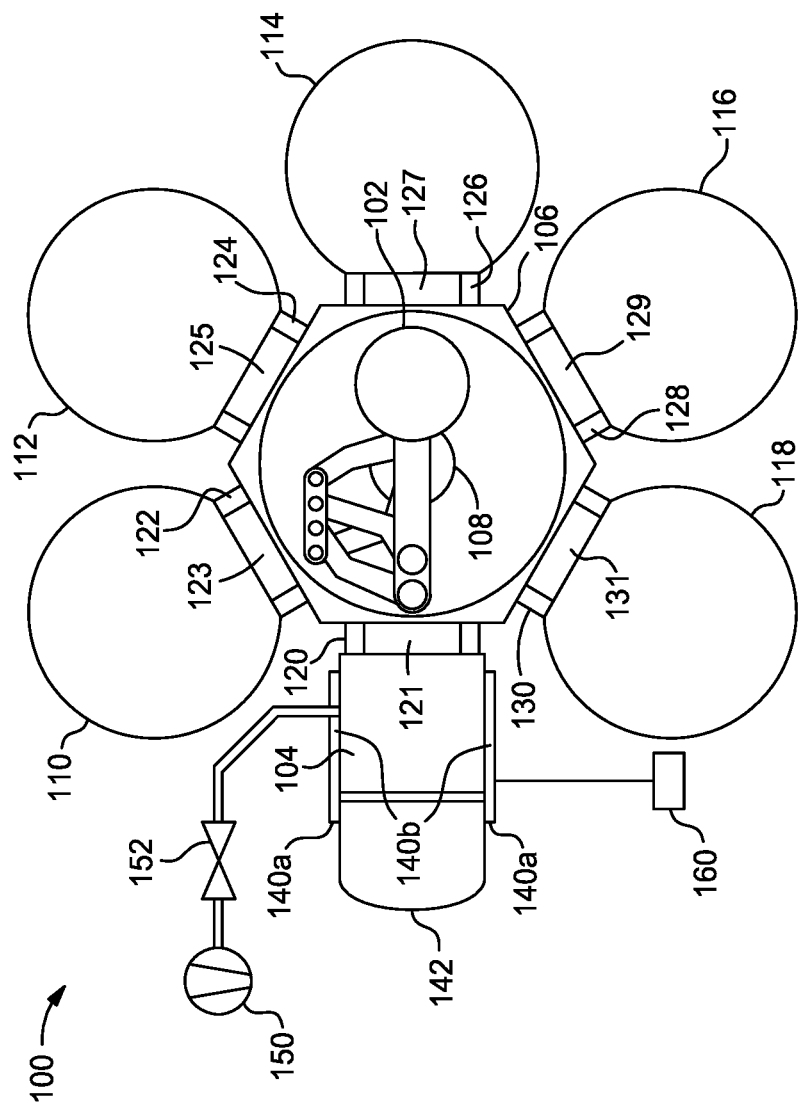
FIG. 1 is a simplified schematic top view of an illustrative processing system, according to some examples.

FIG. 1 is a simplified schematic top view of an illustrative processing system 100, according to some examples. The processing system 100 includes a FOUP load lock 104, a transfer chamber 106, a transfer (e.g., tool and material handling) robot 108 within the transfer chamber 106, a first processing chamber 110, a second processing chamber 112, a third processing chamber 114, a fourth processing chamber 116, and a fifth processing chamber 118. The processing chambers 110, 112, 114, 116, 118 each may be any appropriate processing chamber, such as for a deposition process (e.g., chemical vapor deposition (CVD), atomic layer deposition (ALD), physical vapor deposition (PVD), etc.), an etch process (e.g., reactive ion etch (RIE), plasma etching, etc.), or the like. The processing chambers 110, 112, 114, 116, 118 may be round, rectangular, or another shape, as required by the shape of the substrate to be processed and other processing requirements.

The transfer chamber 106 has slit valve openings 121, 123, 125, 127, 129, 131 in sidewalls between the transfer chamber 106 and the FOUP load lock 104, first processing chamber 110, second processing chamber 112, third processing chamber 114, fourth processing chamber 116, and fifth processing chamber 118, respectively. The transfer robot 108 is positioned and configured to be capable of inserting one or more tools (e.g., substrate handling blades) through each of the slit valve openings 121, 123, 125, 127, 129, 131 and into the adjacent chamber. That is, the transfer robot 108 can insert tools into the FOUP load lock 104, the first processing chamber 110, the second processing chamber 112, the third processing chamber 114, the fourth processing chamber 116, and the fifth processing chamber 118 via slit valve openings 121, 123, 125, 127, 129, 131 in the walls of the transfer chamber 106 between each of the other chambers. The slit valve openings 121, 123, 125, 127, 129, 131 are selectively opened and closed with slit valves 120, 122, 124, 126, 128, 130 to allow access to the interiors of the adjacent chambers when a substrate is to be inserted or removed from one of the adjacent chambers by the transfer robot 108. A substrate 102 is illustrated on the transfer robot 108 within the transfer chamber 106 for transfer.

As described in further detail below, the FOUP load lock 104 includes a FOUP transfer and queueing elevator system. The FOUP transfer and queueing elevator system, as illustrated in FIG. 1, includes vertical track portions 140a and horizontal track portions 140b (collectively, "tracks 140") and further includes one or more shelves 142 capable of moving along the tracks 140. The tracks 140 support the one or more shelves 142 and cause the one or more shelves 142 to move as described below. The one or more shelves 142 can each receive a FOUP from an OHT system, position a FOUP for transfer into the FOUP load lock 104, receive a FOUP from the FOUP load lock 104, position a FOUP in a queue for subsequent transfer into the FOUP load lock 104, and/or position a FOUP to provide the FOUP to the OHT system.

The transfer chamber 106, FOUP load lock 104, and processing chambers 110, 112, 114, 116, 118 include one or more apertures (not shown) that are in fluid communication with a vacuum system (e.g., a vacuum pump). The apertures provide an egress for the gases within the various chambers. In some examples, the chambers are each connected to a separate and independent vacuum system. In still other examples, some of the chambers share a vacuum system, while the other chambers have separate and independent vacuum systems. As illustrated, a vacuum system is in fluid communication with the FOUP load lock 104. The vacuum system includes a vacuum pump 150 and a throttle valve 152 to regulate a flow of gases to or from the FOUP load lock 104. In some examples, the processing system 100 can be maintained in a vacuum or in a low-pressure state by the one or more vacuum systems while one or more substrates are in and transferred between different chambers, including to and from the FOUP load lock 104, the transfer chamber 106, and the processing chambers 110, 112, 114, 116, 118.

The processing system 100 includes one or more process controllers 160, each of which may be or include a computer or system of computers. Each process controller can include a processor that executes program code instructions stored on a tangible, non-transitory medium, such as random access memory (RAM), read-only memory (ROM), etc., to perform and/or control various operations described herein. The process controller (or a respective process controller) can control operations of the FOUP load lock 104, such as movement of the one or more shelves 142 via the tracks 140, transferring a FOUP into and out of the FOUP load lock 104, etc. The process controller can be in communication with a process controller of the OHT system to coordinate delivery of a FOUP between the FOUP transfer and queueing elevator system and the OHT system. The process controller (or another respective process controller) can control operations of the transfer chamber 106, such as operations of the transfer robot 108, opening and closing of slit valves 120, 122, 124, 126, 128, 130, etc. The process controller (or other respective process controllers) can control operations of the processing chambers 110, 112, 114, 116, 118 to implement various processing conditions according to a respective recipe. If multiple process controllers are implemented, the process controllers may each be in communication with one or more of the other process controllers to coordinate various operations.

As illustrated, the processing system 100 includes five processing chambers and one FOUP load lock. In other examples, a processing system can include any number of processing chambers and FOUP load locks. For example, a processing system can include four processing chambers and two FOUP load locks. Other numbers of processing chambers and FOUP load locks can be implemented.

Figure 2:
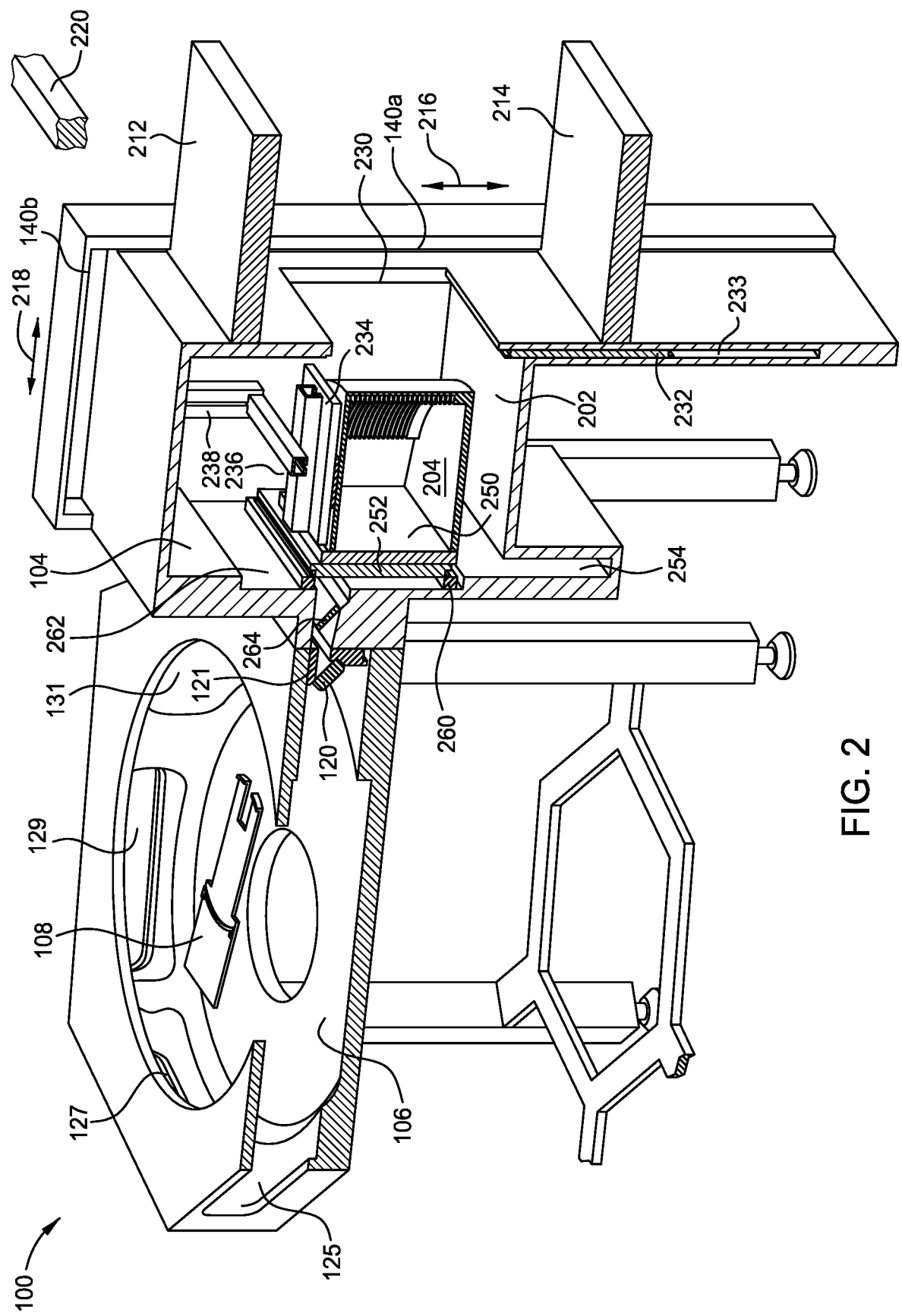
FIG. 2 is a cut-away perspective view of the processing system of FIG. 1, according to some examples.

FIG. 2 illustrates a cut-away perspective view of the processing system 100 of FIG. 1, according to some examples. Many components of the processing system 100 that were described with respect to FIG. 1 are not illustrated in FIG. 2 to avoid obscuring various features that are to be described with respect to FIG. 2. A person having ordinary skill in the art will readily understand the presence of the components in FIG. 2 that are not illustrated therein.

More particularly, FIG. 2 illustrates additional details relating to the FOUP load lock 104. The FOUP load lock 104 includes an interior space 202 defined by various walls (e.g., sidewalls, ceiling, and floor). The FOUP load lock 104 is configured to receive a FOUP 204 into the interior space 202 for transferring substrates from, e.g., other tools in a fab to the various chambers of the processing system 100. The fab environment is the ambient environment outside of the processing system 100, e.g., outside an exterior of the FOUP load lock 104.

Exterior to the interior space 202, the FOUP load lock 104 includes a FOUP transfer and queueing elevator system. The FOUP transfer and queueing elevator system includes the tracks 140 (one track 140 is illustrated in FIG. 2 due to the cut-away), a first shelf 212, and a second shelf 214. The tracks can be any belt or linkage that is motor driven, which motor can be controlled by the controller 160. The first shelf 212 and the second shelf 214 can be mechanically attached or coupled to the belt or linkage, if so implemented. The first shelf 212 and the second shelf 214 are capable of being conveyed along the tracks 140 along a lateral sidewall of the FOUP load lock 104, e.g., along the vertical track portions 140a in a vertical direction 216, and at least the first shelf 212 (and, possibly, the second shelf 214) is capable of being conveyed along a top of the FOUP load lock 104, e.g., along the horizontal track portions 140b in a horizontal direction 218. As will be described in further detail below, when in proper positions, the first shelf 212 and the second shelf 214 each are capable of receiving a FOUP from an automated overhead hoist transfer (OHT) system 220. With a FOUP on one or both of the first shelf 212 and the second shelf 214, the first shelf 212 and the second shelf 214 can be conveyed along the tracks 140 to position the FOUP to transfer the FOUP into the interior space 202 of the FOUP load lock 104 and/or to queue the FOUP to await subsequent transfer of the FOUP into the interior space 202. The first shelf 212 and second shelf 214 each are capable of receiving a FOUP from the interior space 202, and once a FOUP is received from the interior space 202 on one or both of the first shelf 212 and the second shelf 214, one or both of the first shelf 212 and the second shelf 214 can be conveyed along the tracks 140 to position the FOUP to transfer the FOUP to the OHT system 220.

When a FOUP is on one of the first shelf 212 or the second shelf 214, and that shelf is properly positioned along the lateral sidewall of the FOUP load lock 104, the FOUP is transferred into the interior space 202 through a load lock door opening 230. A load lock isolation door 232 is operable to be removed from the load lock door opening 230 for transfer of a FOUP into the interior space 202 and to close the load lock door opening 230 at other times. In the illustrated example, the load lock isolation door 232 is removed from the load lock door opening 230 by the load lock isolation door 232 sliding downwardly into a door pocket 233 in the lateral sidewall of the FOUP load lock 104. The load lock isolation door 232 can close the load lock door opening 230 by sliding upwardly to the load lock door opening 230. The load lock isolation door 232 can form a seal on the load lock door opening 230 when the load lock isolation door 232 is closed to prevent a gas from entering and/or exiting the interior space 202. The load lock isolation door 232 may be moved by an actuator or other movement mechanism, which may further be controlled by the controller 160.

A shuttle is operable to transfer a FOUP (e.g., FOUP 204) from the first shelf 212 or the second shelf 214 into the interior space 202. The shuttle includes a clamp 234, a lateral extender 236, and a vertical lift 238. The clamp 234 is operable to attach to and secure a FOUP (e.g., FOUP 204) and to release the FOUP. The vertical lift 238 is operable to move the clamp 234 vertically for proper vertical position, e.g., of the clamp 234 to attach to and/or release a FOUP and/or, when the clamp 234 is attached to a FOUP 204, of the FOUP. The lateral extender 236 is operable to extend the clamp 234 laterally, e.g., to transfer the FOUP 204 from the first shelf 212 or second shelf 214 into the interior space 202 through the load lock door opening 230, or vice versa. Each of the lateral extender 236 and vertical lift 238 can include a track and a linkage, actuator, or other movement mechanism oriented to provide movement as described herein. Further, the shuttle (e.g., the clamp 234, the lateral extender 236, and the vertical lift 238) can be controlled by the controller 160.

The interior space 202 of the FOUP load lock 104 is fluidly connected to the vacuum system (e.g., vacuum pump 150 via throttle valve 152 (not illustrated in FIG. 2)). After transferring the FOUP 204 into the FOUP load lock 104 and closing the load lock isolation door 232 over the load lock door opening 230, the vacuum system can pump down the interior space 202 to a low pressure and/or a vacuum. The FOUP 204 can be vented during the pump down to create a vacuum in the FOUP 204 that is in equilibrium with the interior space 202. In some examples, the FOUP 204 can be fluidly coupled to the vacuum system to pump an inert gas (e.g., nitrogen ($N_2$)) to the FOUP 204 and purge the inert gas from the FOUP 204. The pressure of gas in the FOUP 204 can be greater than the pressure in the interior space 202. By purging an inert gas in the FOUP 204, substrates in the FOUP 204 can remain clean.

The shuttle is operable to position the FOUP 204 such that a FOUP door 250 of the FOUP 204 is abutting a FOUP door opener 252 of the FOUP load lock 104. The FOUP door opener 252 is proximate an interface between the interior space 202 of the FOUP load lock 104 and the transfer chamber 106. For example, the FOUP door opener 252 is at a lateral sidewall of the FOUP load lock 104 (and within the interior space 202) opposite from the lateral sidewall of the FOUP load lock 104 that has the load lock door opening 230. The FOUP door opener 252 is operable to attach to the FOUP door 250 and to then open the FOUP door 250. In some examples, the FOUP door opener 252 is operable to remove the FOUP door 250 from the FOUP 204 and, with the FOUP door opener 252 attached to the FOUP door 250, is operable to slide downward into a door pocket 254 of the lateral sidewall of the FOUP load lock 104. The FOUP door opener 252 may include a clamp that, when activated, attaches to the FOUP door 250, which further triggers a release mechanism to release the FOUP door 250 from the FOUP 204. The FOUP door opener 252 can be moved by an actuator or other movement mechanism. The clamp and actuator or movement mechanism of the FOUP door opener 242 may be controlled by the controller 160.

An isolation and indexing mechanism 260 is on the lateral sidewall of the FOUP load lock 104 opposite from the lateral sidewall of the FOUP load lock 104 that has the load lock door opening 230. The isolation and indexing mechanism 260 encircles the interface between the interior space 202 of the FOUP load lock 104 and the transfer chamber 106 (e.g., the slit valve opening 121 through the lateral sidewall). The isolation and indexing mechanism 260 is moveable along the lateral sidewall, e.g., by implementing a glide or a track. In the illustrated example, the lateral sidewall has a cut-out in which the isolation and indexing mechanism 260 is moveable. The cut-out can function to limit the movement of the isolation and indexing mechanism 260 along the lateral sidewall. The shuttle is operable to position the FOUP 204, with the FOUP door 250 opened, such that a face of the FOUP 204 abuts the isolation and indexing mechanism 260. When the face of the FOUP 204 abuts the isolation and indexing mechanism 260, a shield may be formed between the lateral sidewall of the FOUP load lock 104 and the FOUP 204 by the isolation and indexing mechanism 260. The shuttle is operable to move the FOUP 204 in any direction to abut the face of the FOUP 204 to the isolation and indexing mechanism 260, such as by translation and/or rotation. The isolation and indexing mechanism 260 can include a deflector and bellow that form the shield between the lateral sidewall and the FOUP 204. A small gap may be between the FOUP 204 and the lateral sidewall to permit movement of the FOUP 204 relative to the slit valve opening 121 through the lateral sidewall. The deflector and bellow can shield possible particulates or contaminates from flowing through the gap into the transfer chamber 106. In some examples, the FOUP 204 may remain stationary while abutting the isolation and indexing mechanism 260. As will become more apparent subsequently, if the transfer robot 108 is capable of moving vertically sufficiently through the slit valve opening 121, the transfer robot 108 may be able to access substrates in the FOUP 204 without the FOUP 204 moving while being engaged with the isolation and indexing mechanism 260. Under such circumstances, the isolation and indexing mechanism 260 can be immoveable and can form a seal between the face of the FOUP 204 and the lateral sidewall of the FOUP load lock 104. The seal may be formed by an O-ring or the like of the isolation and indexing mechanism 260. Various pressure differentials may be created, e.g., between the interior space of the FOUP 204 and the interior space 202 of the FOUP load lock 104, when a seal is formed.

A sensor and/or camera (not illustrated) may be disposed in or adjacent to the slit valve opening 121 proximate the lateral sidewall. The sensor and/or camera can view into the FOUP 204 when the FOUP 204 abuts the isolation and indexing mechanism 260. The sensor and/or camera is operable to view the substrates in the FOUP 204 and, in conjunction with the controller 160, to determine respective positions of the substrates in the FOUP 204 to map the substrates. The controller 160 can responsively control the shuttle to move the FOUP 204 to index the substrates for access by the transfer robot 108.

The FOUP load lock 104 further includes a tunnel isolation door 264 in the slit valve opening 121 through the lateral sidewall of the FOUP load lock 104. The tunnel isolation door 264 is operable to open and close, e.g., by an actuator controlled by the controller 160. When the tunnel isolation door 264 is in the closed position, the interior space 202 may, e.g., be pumped down to a low pressure or a vacuum. When the tunnel isolation door 264 is open, which may further be in coordination with the opening of the slit valve 120, the transfer robot 108 may access one or more substrates in the FOUP 204 through the slit valve opening 121.

FIGS. 3 through 8 are partial cut-away perspective views of the processing system 100 illustrating a sequence of operations for loading FOUPs to the FOUP load lock 104, according to some examples. Various movements of the first shelf 212 and the second shelf 214 are described herein. The first shelf 212 and the second shelf 214 may be linked together such that the movement of the first shelf 212 and the second shelf 214 is coordinated and in parallel. In other examples, the first shelf 212 may move independently of the second shelf 214.

Figure 3:
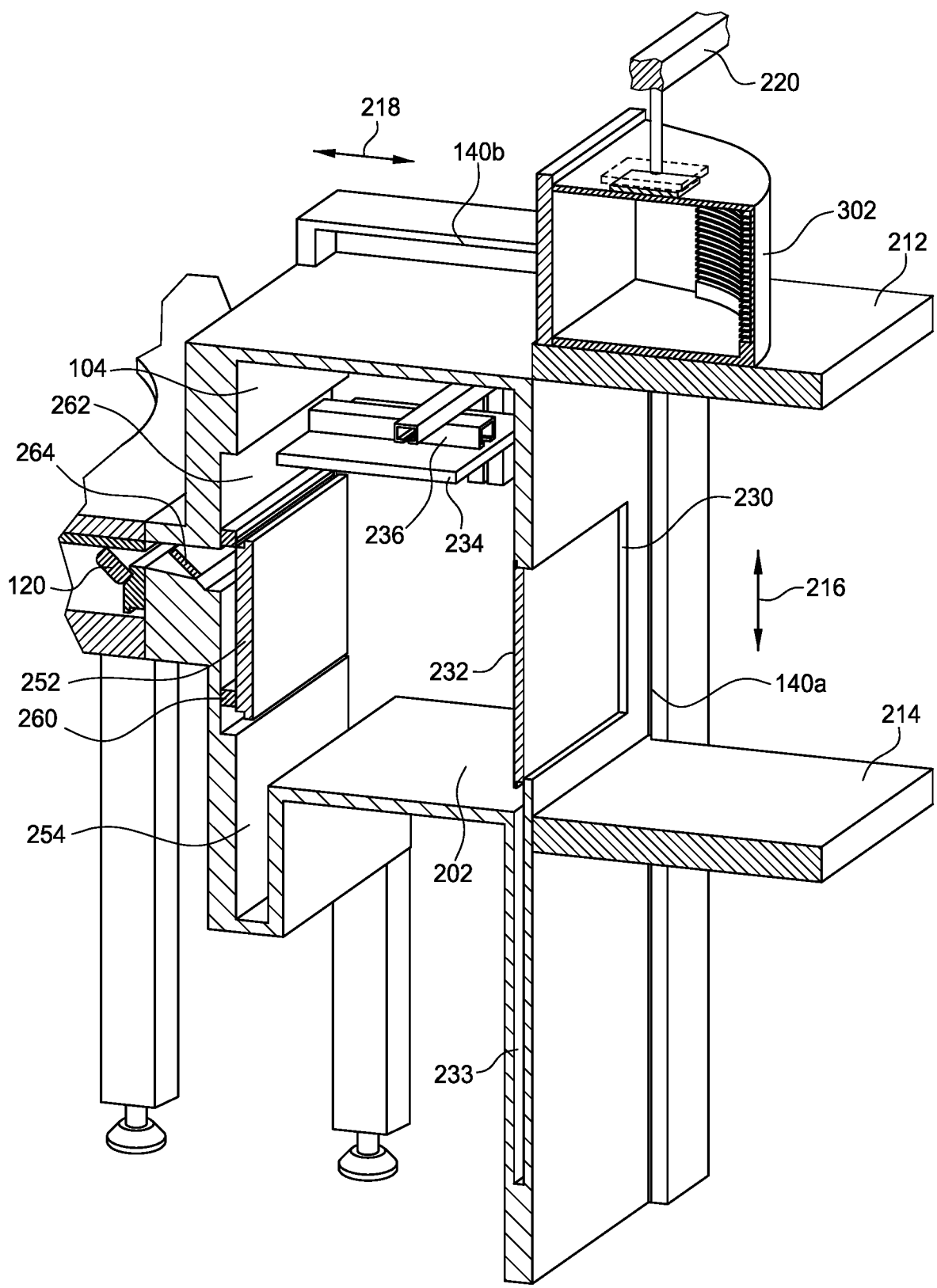
FIGS. 3 through 8 are partial cut-away perspective views of the processing system of FIG. 1 illustrating a sequence of operations for loading a Front Opening Unified Pod (FOUP) to a FOUP load lock, according to some examples.

In FIG. 3, the first shelf 212 moves to a loading position proximate the OHT system 220. Depending on an initial positioning of the first shelf 212, the first shelf 212 may move in a vertical direction 216 and/or a horizontal direction 218 along the tracks 140 to the loading position. At the loading position, any shelf is capable of receiving a FOUP from the OHT system 220 and/or of providing a FOUP to the OHT system 220. In FIG. 3, the first shelf 212 at the loading position receives a first FOUP 302 from the OHT system 220. The second shelf 214 may be at any position along the tracks 140 when the first shelf 212 is at the loading position.

Figure 4:
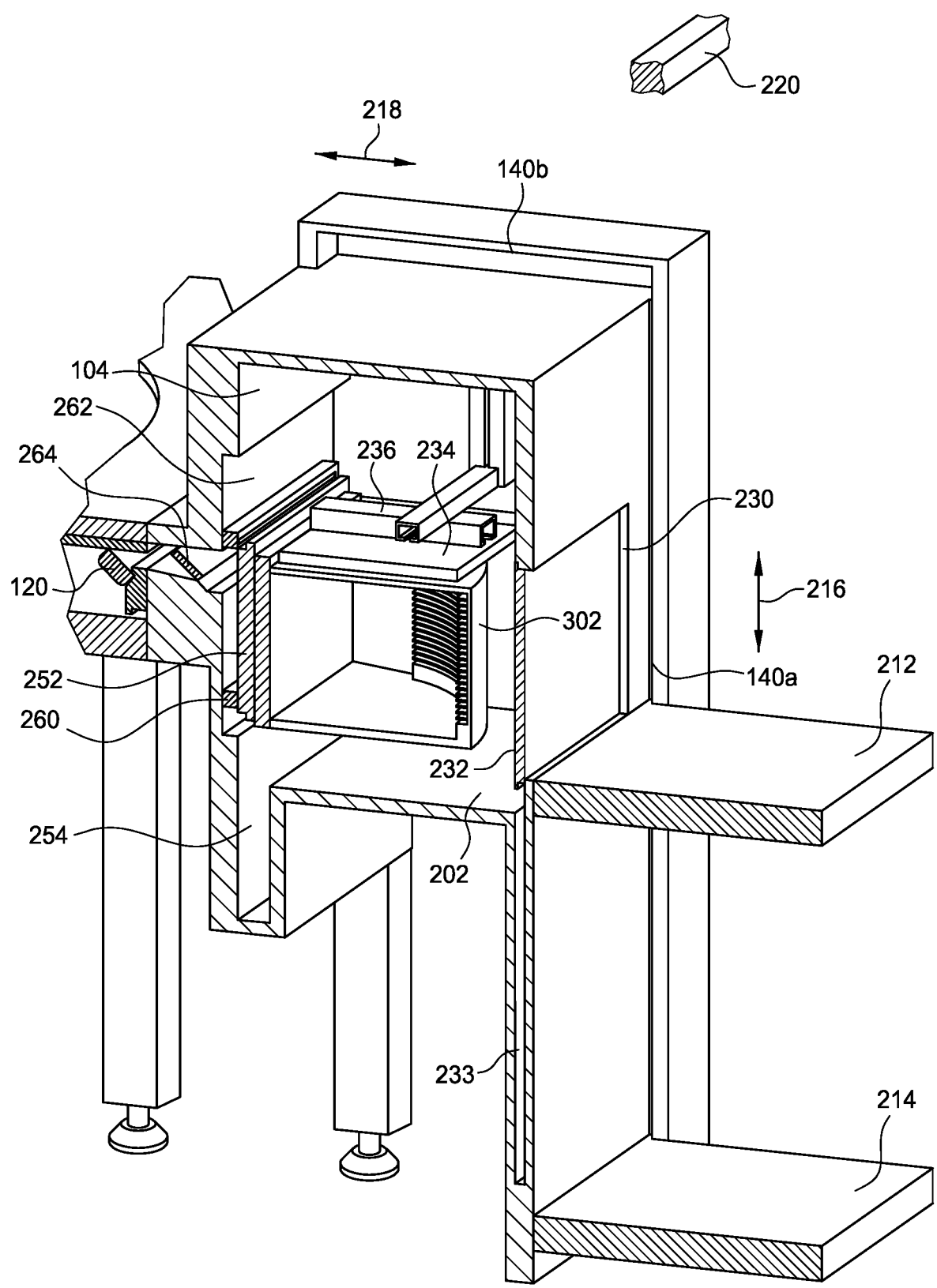

In FIG. 4, the first shelf 212 moves, with the first FOUP 302 thereon, to a load lock transfer position at the load lock door opening 230. As illustrated, the first shelf 212 moves down the vertical track portions 140a in a vertical direction 216 from the loading position to the load lock transfer position. Once at the load lock transfer position, the first FOUP 302 is transferred from the first shelf 212 to the interior space 202 of the FOUP load lock 104 through the load lock door opening 230, as will be described in further detail below. The second shelf 214 may be at any position along the tracks 140 when the first shelf 212 is at the load lock transfer position and/or is moving from the loading position to the load lock transfer position. In some examples, the second shelf 214 is at a queueing position (to be described below) when the first shelf 212 is at the load lock transfer position.

Figure 5:
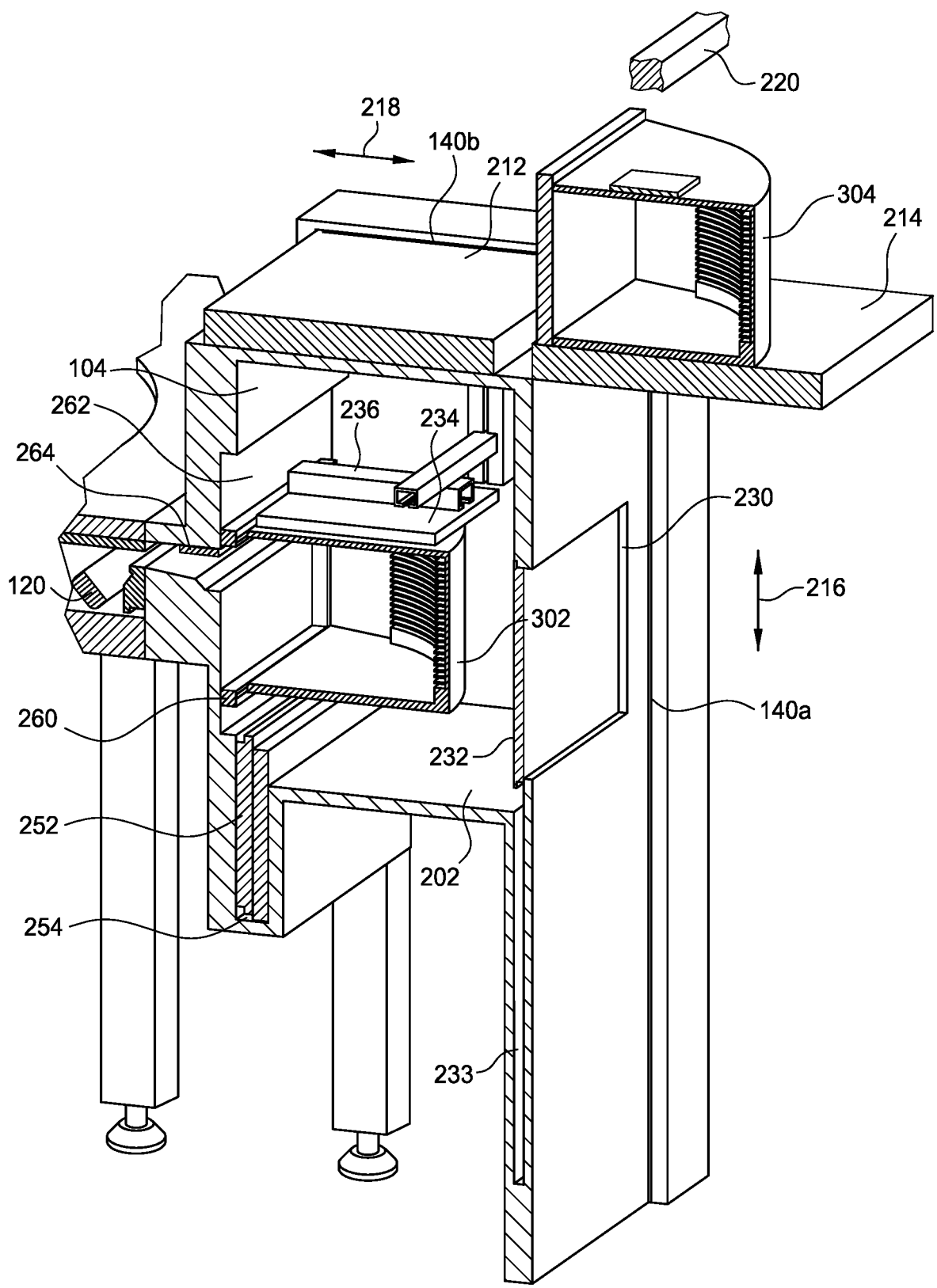

In FIG. 5, after the first FOUP 302 is transferred into the interior space 202, the first shelf 212 moves to a cleared position, and the second shelf 214 moves to the loading position. The first shelf 212 moves, after the first FOUP 302 is transferred into the interior space 202, from the load lock transfer position to the cleared position by moving up the vertical track portions 140a in a vertical direction 216 and across the horizontal track portions 140b in a horizontal direction 218. In the illustrated example, the cleared position is above the ceiling defining the interior space 202, although in other examples, the cleared position may be located at a different position. The second shelf 214 moves up the vertical track portions 140a in a vertical direction 216 to the loading position proximate the OHT system 220. With the first shelf 212 in the cleared position, the second shelf 214 may move to the loading position, and may receive a FOUP from the OHT system 220, without obstruction from the first shelf 212. The second shelf 214 at the loading position receives a second FOUP 304 from the OHT system 220.

Figure 6:
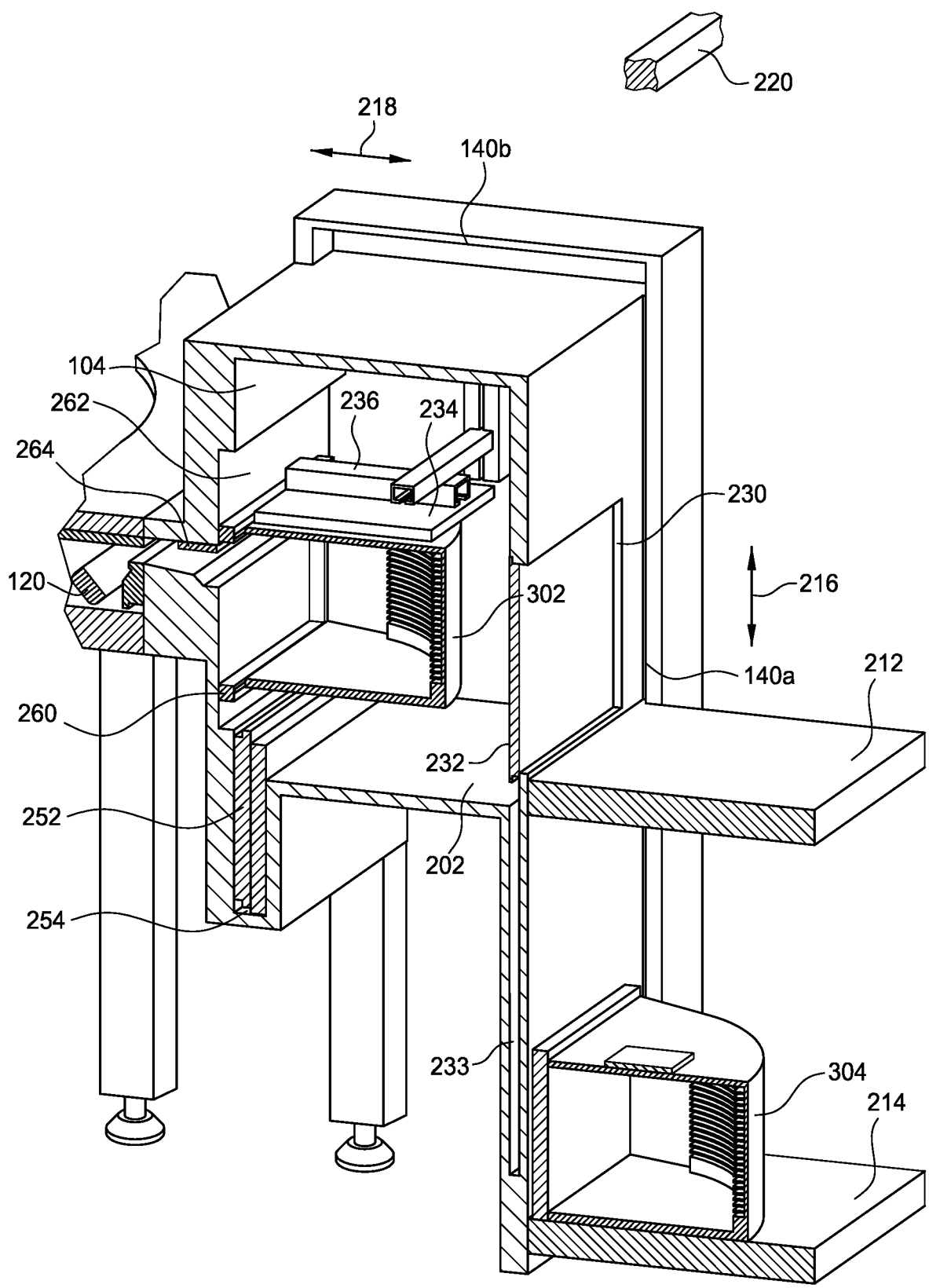

In FIG. 6, after the second shelf 214 receives the second FOUP 304, the second shelf 214 moves from the loading position to a queueing position, and the first shelf 212 moves from the cleared position to the load lock transfer position. The second shelf 214 moves down the vertical track portions 140a in a vertical direction 216 from the loading position to the queueing position. The first shelf 212 moves across the horizontal track portions 140b in a horizontal direction 218 and then down the vertical track portions 140a in a vertical direction 216 from the cleared position to the load lock transfer position. In the load lock transfer position, the first shelf 212 awaits completion of processing of substrates that were transferred into the FOUP load lock 104 by the first FOUP 302. Once processing of those substrates is complete, the first FOUP 302 will be transferred from the interior space 202 to the first shelf 212. In the queueing position, the second shelf 214, with the second FOUP 304 thereon, is clear of the first shelf 212 moving into the load lock transfer position, and the second shelf 214, with the second FOUP 304 thereon, awaits the transferring the first FOUP 302 out of the interior space 202 and subsequently moving the first shelf 212, with the first FOUP 302 thereon, away from the load lock door opening 230.

Figure 7:
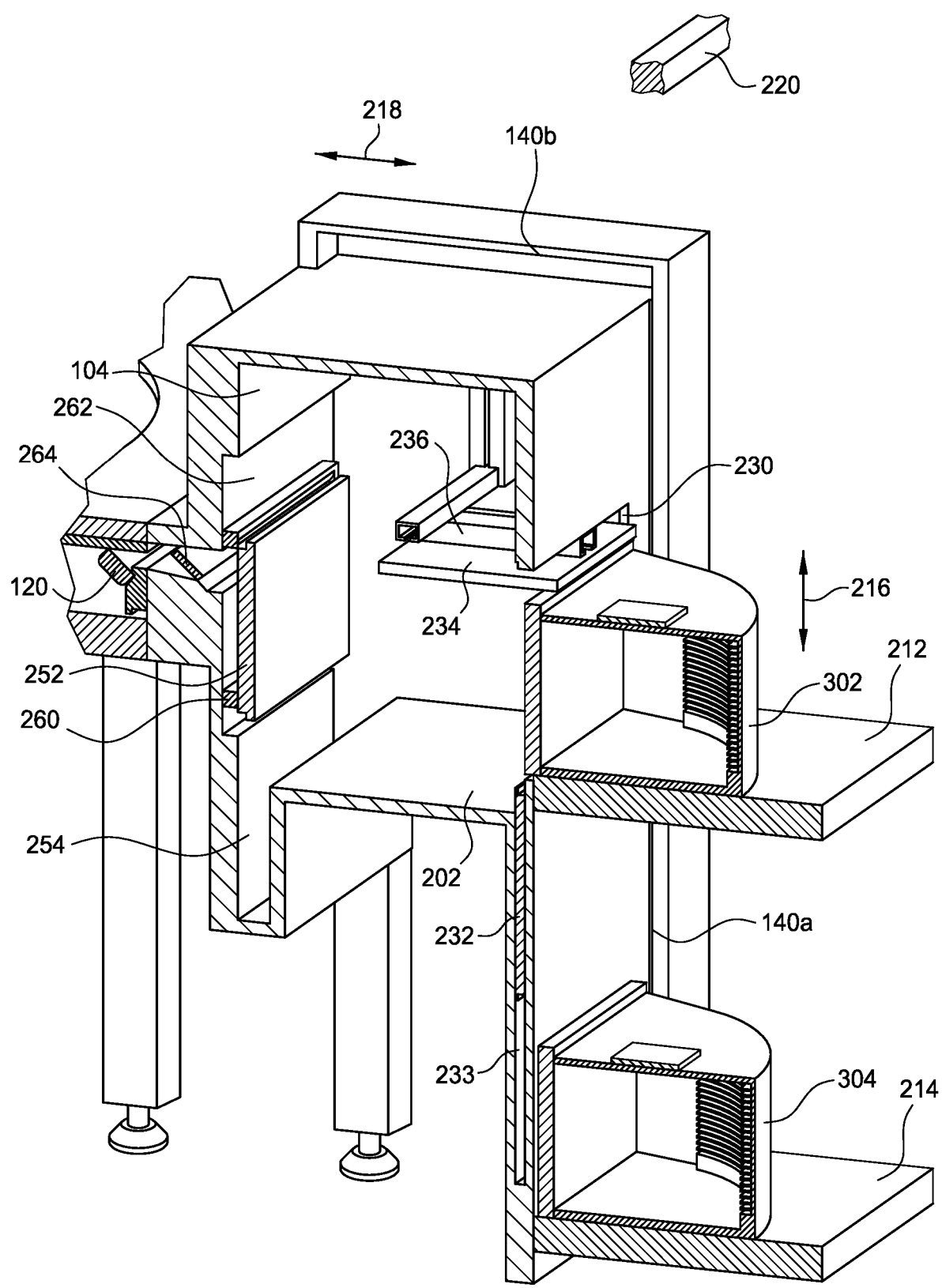

In FIG. 7, the first FOUP 302 is transferred, through the load lock door opening 230, from the interior space 202 to the first shelf 212 at the load lock transfer position. Additional details of this transfer are described below.

Figure 8:
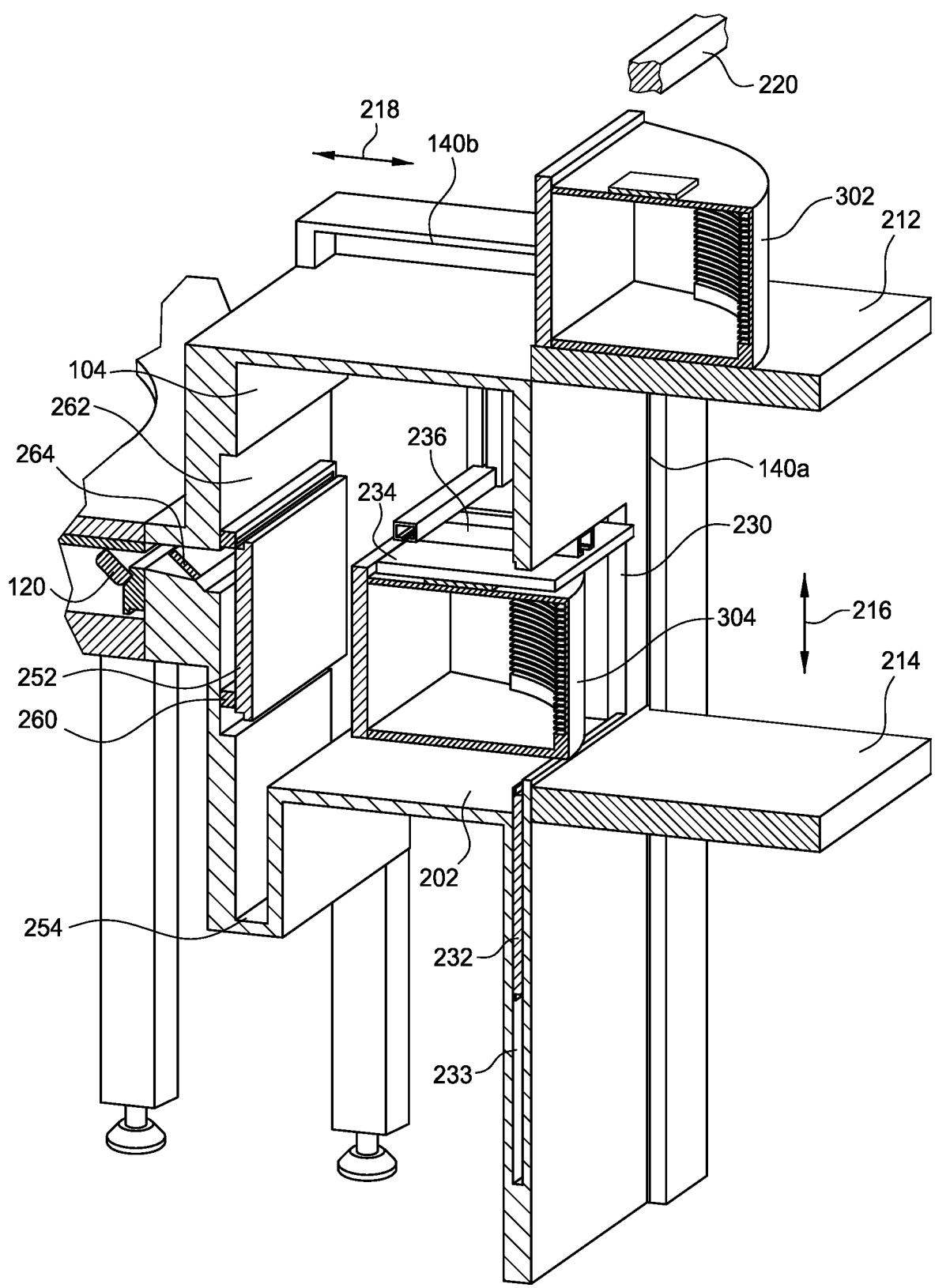

In FIG. 8, after the first FOUP 302 is transferred to the first shelf 212, the first shelf 212 moves up the vertical track portions 140a in a vertical direction 216 to the loading position, and the second shelf 214, with the second FOUP 304 thereon, moves up the vertical track portions 140a in a vertical direction 216 to the load lock transfer position. Once at the load lock transfer position, the second FOUP 304 is transferred from the second shelf 214 to the interior space 202 of the FOUP load lock 104 through the load lock door opening 230. At the loading position, the first shelf 212 provides the first FOUP 302 to the OHT system 220, which may remove the first FOUP 302 from the first shelf 212.

After the OHT system 220 unloads the first FOUP 302 from the first shelf 212 and after the second FOUP 304 is transferred into the interior space 202, the first shelf 212 moves to the cleared position, and the second shelf 214 moves to the loading position, as described with respect to FIG. 5. At the loading position, the second shelf 214 receives another FOUP from the OHT system 220, and the cycle of FIGS. 5 through 8 can be repeated for any number of FOUPs.

Figure 9:
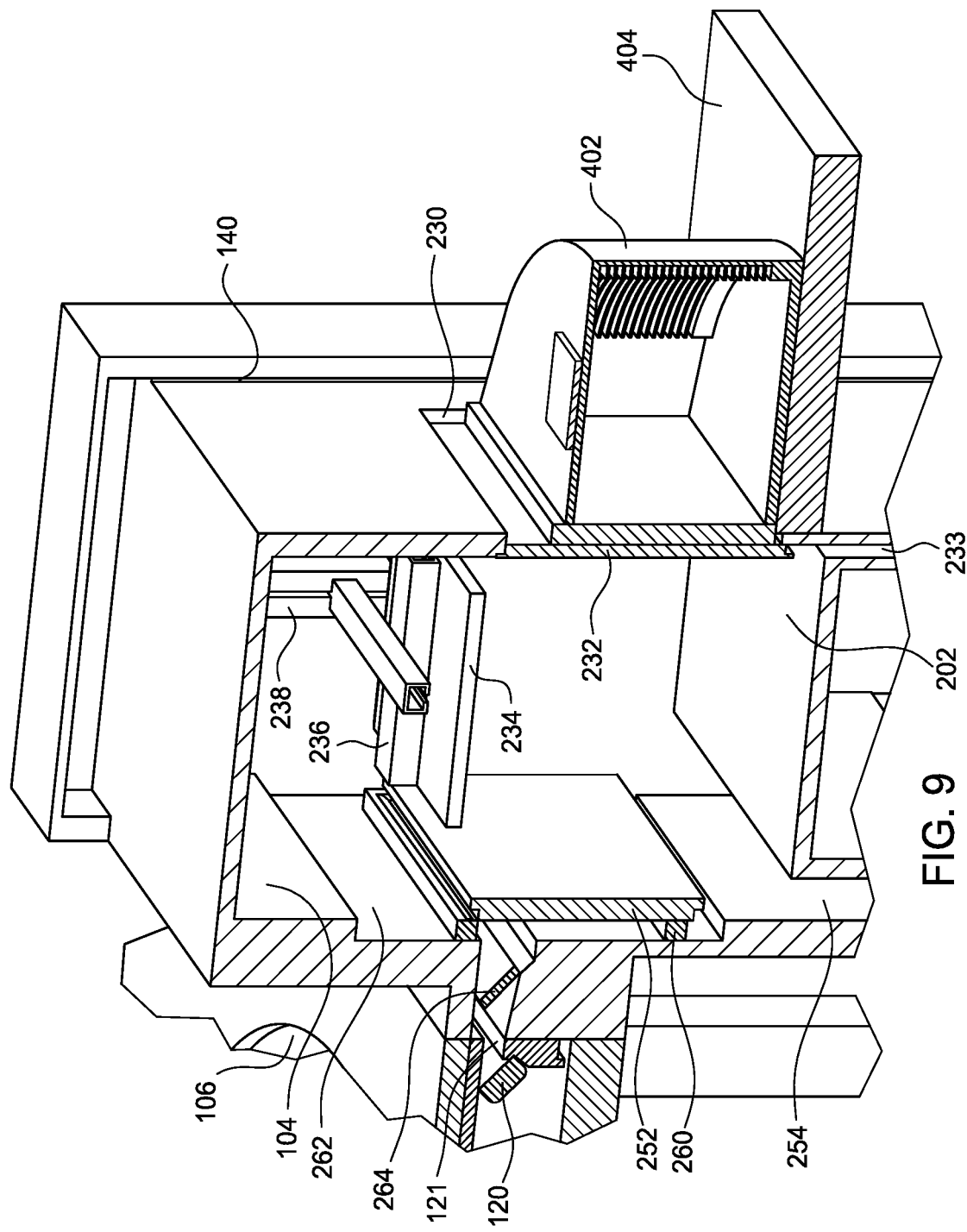
FIGS. 9 through 11 are partial cut-away perspective views of the processing system of FIG. 1 illustrating a sequence of operations for transferring a FOUP into and/or out of an interior space of the FOUP load lock and for transferring substrates between the FOUP and a transfer chamber, according to some examples.
Figure 10:
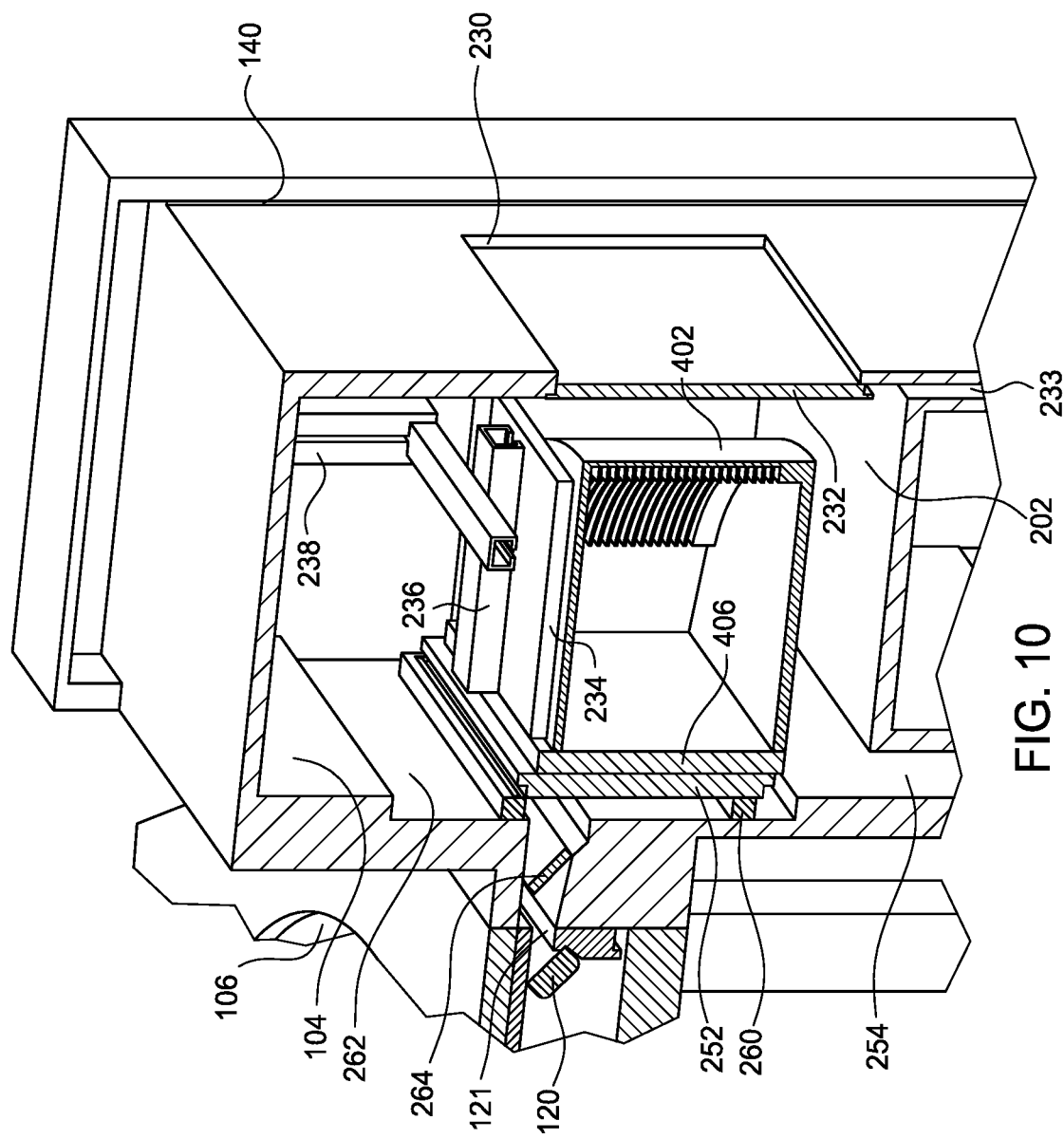
Figure 11:
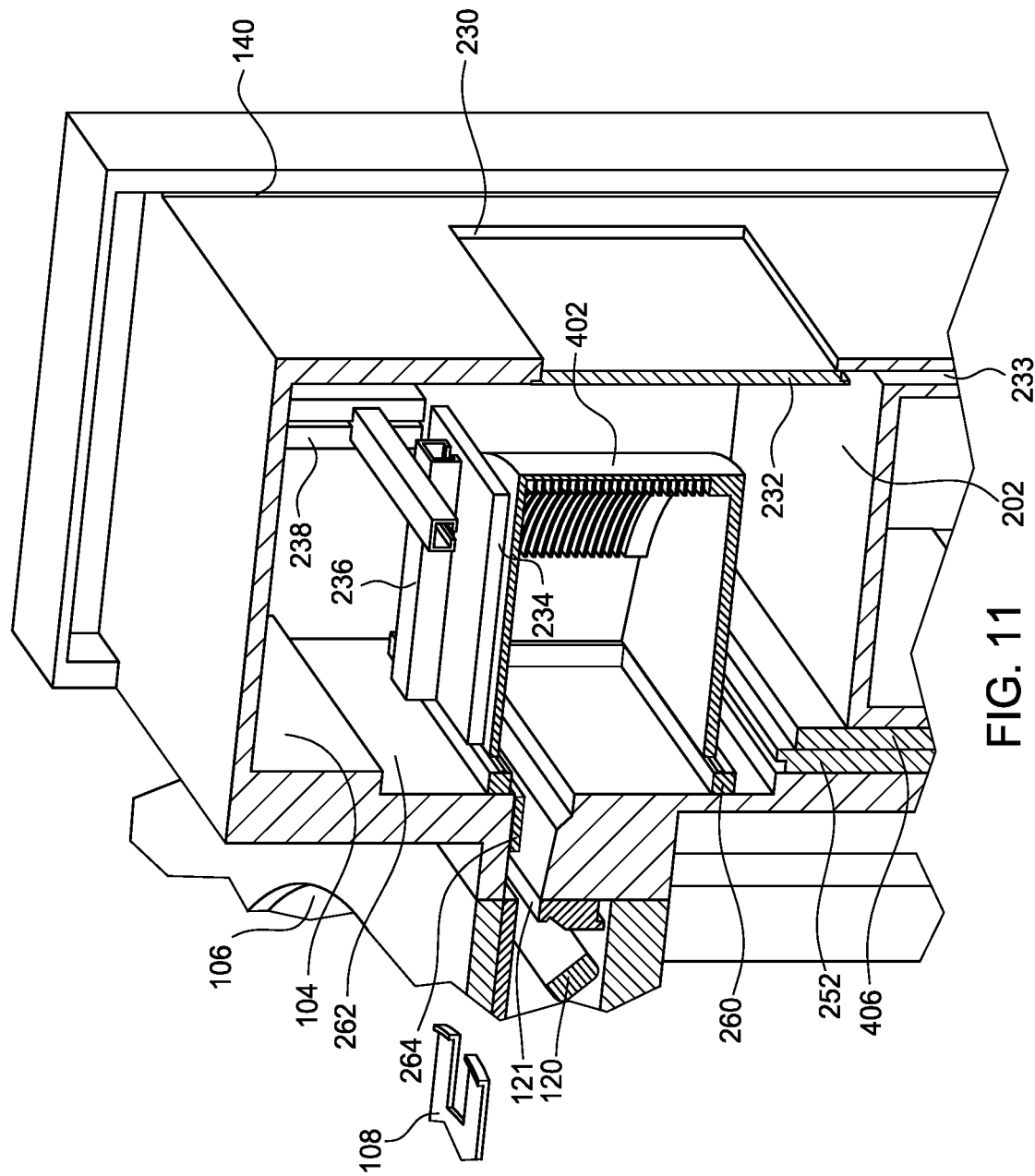

FIGS. 9 through 11 are partial cut-away perspective views of the processing system 100 illustrating a sequence of operations for transferring a FOUP into and/or out of the interior space 202 of the FOUP load lock 104 and for transferring substrates between the FOUP and the transfer chamber 106, according to some examples. Each FOUP delivered to the FOUP load lock 104 can have one or multiple substrates (e.g., up to 25 substrates, in some examples) enclosed therein. Each substrate may be disposed in a slot in the FOUP for transport.

As shown in FIG. 9, and as described above with respect to FIGS. 4 and/or 8, a FOUP 402 (e.g., first FOUP 302 or second FOUP 304) is provided on a shelf 404 (e.g., first shelf 212 or second shelf 214) at the load lock transfer position. In the illustrated state, the interior space 202 of the FOUP load lock 104 is closed off from other chambers and any other ambient environment in which the FOUP load lock 104 is disposed (e.g., the environment inside the fab). For example, the load lock isolation door 232 and tunnel isolation door 264 are in closed positions, and any valve of the vacuum system that is in fluid connection with the interior space 202 is closed. One or more valves (e.g., of the vacuum system) between the interior space 202 and the ambient environment may be opened and/or a gas (e.g., an ambient gas and/or inert gas) may be pumped into the interior space 202 to bring the pressure of the interior space 202 into equilibrium with the ambient environment (which may be approximately 1 atm).

With the interior space 202 at a pressure that is at equilibrium with the ambient environment, the load lock isolation door 232 is removed from the load lock door opening 230. For example, the load lock isolation door 232 is moved downwardly into the door pocket 233 of the sidewall of the FOUP load lock 104 to remove the load lock isolation door 232 from the load lock door opening 230.

The shuttle moves, by the vertical lift 238, to position the clamp 234 vertically at a level above the FOUP 402 on the shelf 404 and below an upper boundary of the load lock door opening 230. The shuttle then moves, by the lateral extender 236, the clamp 234 laterally out the load lock door opening 230 and positions the clamp 234 directly above the FOUP 402. The vertical lift 238 then lowers the clamp 234 to engage and attach to the FOUP 402. With the clamp 234 attached to the FOUP 402, the vertical lift 238 raises the clamp 234, and hence, also the FOUP 402, which lifts the FOUP 402 from the shelf 404. The lateral extender 236 then retracts to bring the clamp 234 and attached FOUP 402 through the load lock door opening 230 into the interior space 202.

Referring to FIG. 10, with the FOUP 402 transferred into the interior space 202, the load lock isolation door 232 is moved to close the load lock door opening 230. For example, the load lock isolation door 232 is moved upwardly from the door pocket 233 of the sidewall of the FOUP load lock 104 to cover the load lock door opening 230. With the load lock isolation door 232 closing the load lock door opening 230, the vacuum system pumps down the interior space 202 to a lower pressure or a vacuum. The FOUP 402 can be vented during the pump down to create a vacuum in the FOUP 402 that is in equilibrium with the interior space 202.

The shuttle positions the FOUP 402 such that the FOUP door 406 of the FOUP 402 engages the FOUP door opener 252. The shuttle can use the lateral extender 236 (for lateral movement) and/or the vertical lift 238 (for vertical movement) to position the FOUP 402 such that the FOUP door 406 engages the FOUP door opener 252. By engaging the FOUP door opener 252, the FOUP door 406 is released from a face of the FOUP 402. The FOUP door opener 252, with the FOUP door 406 engaged, removes the FOUP door 406 from the face of the FOUP 402, such as downwardly into the door pocket 254 of the sidewall of the FOUP load lock 104.

The positioning of substrates in the FOUP 402 is mapped. The sensor and/or camera in the slit valve opening 121 can detect the position of the substrates in the FOUP 402, which in conjunction with the controller 160, can be used to map the positioning of the substrates.

Referring to FIG. 11, the shuttle positions the FOUP 402 such that the face of the FOUP 402 engages the isolation and indexing mechanism 260. The isolation and indexing mechanism 260 can form a shield around the face of the FOUP 402 from the lateral sidewall of the FOUP load lock 104. The vacuum system may further pump down the interior space 202 to maintain and/or create a vacuum in the interior space 202. The vacuum system or another gas system can increase a pressure of an inert gas (e.g., nitrogen ($N_2$) gas) in the transfer chamber 106 to be greater than the pressure of gas in the interior space 202 of the FOUP load lock 104. In some examples, the isolation and indexing mechanism 260 forms a seal between the face of the FOUP 402 from the lateral sidewall of the FOUP load lock 104.

The tunnel isolation door 264 is opened, and the slit valve 120 is opened. The pressures in the FOUP 402 and transfer chamber 106 are therefore equalized. With the tunnel isolation door 264 and slit valve 120 open, the transfer robot 108 can extend through the slit valve opening 121 to access a substrate in the FOUP 402. With the tunnel isolation door 264 and slit valve 120 open, due to the pressure differential between the transfer chamber 106 and the FOUP load lock 104, the inert gas can flow from the transfer chamber 106 through any gap between the lateral sidewall of the FOUP load lock 104 and the FOUP 402. This flow of the inert gas can reduce particulates and contamination that may flow into the transfer chamber 106. Additionally, an inert gas can be pumped into the FOUP 402 to create a greater pressure in the FOUP 402 than the interior space 202, which can help reduce particulates and contamination inside the FOUP 402.

Once the transfer robot 108 accesses a substrate, the transfer robot 108 can retract back through the slit valve opening 121 with the substrate. The transfer robot 108 can then transfer the substrate to any of the processing chambers 110, 112, 114, 116, 118 for processing according to the particular chamber. The transfer robot 108 can further transfer the processed substrate to and between different ones of the processing chambers 110, 112, 114, 116, 118. After processing of the substrate, the transfer robot 108 can remove the substrate from one of the processing chambers 110, 112, 114, 116, 118. The slit valve 120 and tunnel isolation door 264 then open, and the transfer robot 108 extends, with the processed substrate, through the slit valve opening 121 to transfer the substrate back to the FOUP 402.

In some examples, the shuttle can further vertically move the FOUP 402, while the face of the FOUP 402 remains engaged with the isolation and indexing mechanism 260, to index a particular substrate or position within the FOUP 402 with the transfer robot 108. As indicated above, the FOUP 402 can have multiple slots, where each slot may have a substrate. When engaged with the isolation and indexing mechanism 260, each substrate in the FOUP 402 is generally oriented horizontally such that the substrate can be transferred through the slit valve opening 121 without rotation. The shuttle can therefore vertically lift the FOUP 402 to align a substrate or position in the FOUP 402 such that the transfer robot 108 can access the substrate or position in the FOUP 402. The isolation and indexing mechanism 260 can remain engaged with the face of the FOUP 402 while the shuttle vertically aligns the FOUP 402 such that the transfer robot 108 can access a particular substrate or position in the FOUP 402. In some examples, the transfer robot 108 is capable of moving vertically sufficiently through the slit valve opening 121, and the shuttle does not vertically move the FOUP 402. In such examples, the isolation and indexing mechanism 260 can form a seal between the face of the FOUP 204 and the lateral sidewall of the FOUP load lock 104.

Any number of substrates can be removed from and/or remain in the FOUP 402 at any given time while the FOUP 402 is in the FOUP load lock 104. For example, each of the processing chambers 110, 112, 114, 116, 118 may have a substrate for processing at any time. Hence, the transfer robot 108 can remove an appropriate number of substrates from the FOUP 402 before transferring any of those substrates back to the FOUP 402.

Once the processed substrates are transferred back to the FOUP 402, the slit valve 120 and tunnel isolation door 264 are closed. The interior space 202 and the FOUP 402 are brought into equilibrium with the FOUP 402 de-coupled from the pressure of the transfer chamber. The shuttle laterally moves the FOUP 402 to disengage from the isolation and indexing mechanism 260. The FOUP door opener 252 moves (e.g., vertically upward from the door pocket 254 in the illustrated example) to place the FOUP door 406 on the face of the FOUP 402. The vacuum system can then open a valve to the ambient environment to bring the pressure of the interior space 202 into equilibrium with the ambient environment. With the interior space 202 at a pressure that is in equilibrium with the pressure of the ambient environment, the load lock isolation door 232 is removed from the load lock door opening 230 (e.g., by moving the load lock isolation door 232 downwardly into the door pocket 233). The shuttle then moves the FOUP 402 through the load lock door opening 230 and onto a shelf (which may be the shelf 404 or a different shelf), such as described with respect to and illustrated by FIG. 7. After placing the FOUP 402 on the shelf, the shuttle retracts back to the interior space 202 and the load lock isolation door 232 closes the load lock door opening 230.

Figure 12:
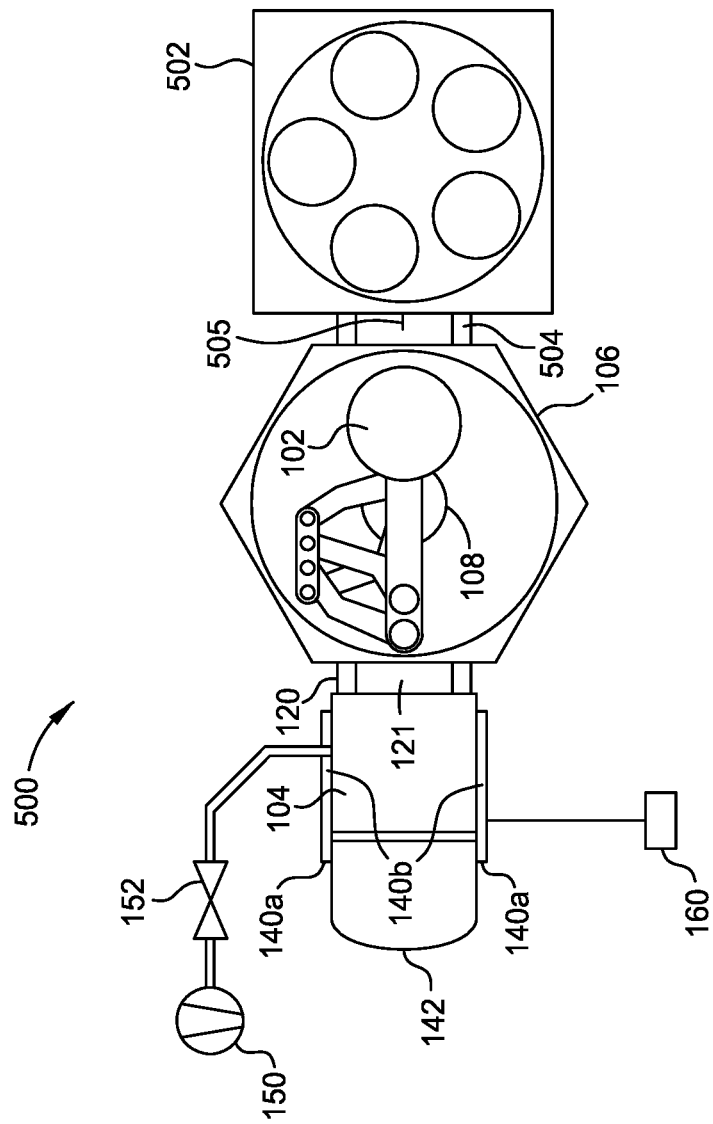
FIG. 12 is a simplified schematic top view of another illustrative processing system, according to some examples.

FIG. 12 is a simplified schematic top view of another illustrative processing system 500, according to some examples. The processing system 500 includes components that are included in the processing system 100 of FIG. 1, and hence, description of those components is omitted for brevity. The processing system 500 includes a batch processing chamber 502 with a slit valve 504 and slit valve opening 505 between the batch processing chamber 502 and the transfer chamber 106. The transfer robot 108 can transfer substrates between the transfer chamber 106 and the batch processing chamber 502 via the slit valve opening 505 similar to as described above. The batch processing chamber 502 can process multiple substrates simultaneously. A person having ordinary skill in the art will readily understand other modification to implement the processing system 500. Further, the processing system 500 can include on or more additional processing chambers, which may be single substrate or batch processing chambers, and can include one or more additional FOUP load locks.

As described herein, some examples implement a FOUP load lock in a processing system. The FOUP load lock can obviate the need for costly and large equipment. Hence, the FOUP load lock can reduce costs and a footprint of the processing system. This can enable standalone applications for improved research and development placement. Additionally, an elevator system implemented with the FOUP load lock can reduce downtime of a processing system that might otherwise be associated with waiting on delivery of a FOUP. This can increase throughput of substrates through a processing system. Even further, fewer substrate (e.g., wafer) handling operations can be implemented by processes that use the FOUP load lock, which can in turn reduce possible exposure to dust or other particles that could be problematic.

While the foregoing is directed to embodiments of the present disclosure, other and further embodiments of the disclosure may be devised without departing from the basic scope thereof, and the scope thereof is determined by the claims that follow.

The invention claimed is:

1. A processing system for processing a substrate, the processing system comprising:
a Front Opening Unified Pod (FOUP) load lock having walls defining an interior space therein, the FOUP load lock comprising:
a load lock isolation door operable to close a load lock isolation door opening in a first sidewall of the FOUP load lock, the load lock isolation door opening being sized so that a FOUP is capable of passing therethrough to and from the interior space;
a tunnel isolation door operable to close a first slit valve opening in a second sidewall of the FOUP load lock, the first slit valve opening being sized so that a substrate capable of being placed in the FOUP is capable of passing through the first slit valve opening to and from the interior space; and
a shuttle disposed in the interior space, the shuttle configured to maintain the substrates in the FOUP in a horizontal orientation, the shuttle comprising:
a clamp;
a lateral extender operable to extend the clamp laterally while maintaining the horizontal orientation of the substrates;
and a vertical lift; and
a vacuum system fluidly connected to the interior space of the FOUP load lock, the vacuum system being operable to pump down a pressure of the interior space of the FOUP load lock.

2. The processing system of claim 1 further comprising:
a transfer chamber attached to the FOUP load lock, the transfer chamber comprising a transfer robot, the transfer robot being operable to transfer a substrate from the FOUP in the FOUP load lock to the transfer chamber via the first slit valve opening; and
a processing chamber attached to the transfer chamber, the transfer robot being operable to transfer a substrate from the transfer chamber to the processing chamber via a second slit valve opening.

3. The processing system of claim 1, wherein the FOUP load lock further comprises:
a FOUP elevator system disposed on the FOUP load lock outside the interior space, the FOUP elevator system comprising a first shelf and a second shelf, the first shelf and the second shelf being operable to move at least along the first sidewall of the FOUP load lock, the first shelf and the second shelf being operable to move to a loading position to receive or provide a FOUP and to move to a load lock transfer position to transfer a FOUP through the load lock isolation door opening to or from the interior space, the first shelf being operable to move to a cleared position when the second shelf is in the loading position, the second shelf being operable to move to a queueing position when the first shelf is in the load lock transfer position.

4. The processing system of claim 1, wherein the shuttle is operable to attach to the FOUP using the clamp and to move the FOUP through the load lock isolation door opening and within the interior space by lateral movement using the lateral extender and by vertical movement using the vertical lift, the shuttle further being operable to position the FOUP at the second sidewall of the FOUP load lock for access to a substrate in the FOUP through the first slit valve opening.

5. The processing system of claim 1, wherein the FOUP load lock further comprises:

a FOUP door opener operable to engage a FOUP door and remove the FOUP door from the FOUP.

6. The processing system of claim 1, wherein the FOUP load lock further comprises:
an isolation and indexing mechanism on the second sidewall of the FOUP load lock and surrounding the first slit valve opening, the isolation and indexing mechanism being operable to engage a face of the FOUP and being operable to move along the second sidewall when the FOUP is moved to index the FOUP.

7. A method for providing a substrate to a processing system, the method comprising:
positioning a first Front Opening Unified Pod (FOUP) at a load lock door opening of a FOUP load lock, wherein the substrates are in a horizontal position in the FOUP;
using a shuttle, transferring the first FOUP through the load lock door opening to an interior space of the FOUP load lock while maintaining the substrates in the horizontal position;
after transferring the first FOUP to the interior space, pumping down a pressure of the interior space; and
using the shuttle, positioning the first FOUP at a slit valve opening of the FOUP load lock.

8. The method of claim 7 further comprising accessing, via the slit valve opening, a substrate in the first FOUP by a transfer robot of a transfer chamber, the transfer chamber being attached to the FOUP load lock.

9. The method of claim 7 further comprising mapping respective positions of substrates in the first FOUP while the first FOUP is in the interior space.

10. The method of claim 7, wherein positioning the first FOUP at the load lock door opening comprises:
receiving the first FOUP on a shelf of a FOUP elevator system of the FOUP load lock from an overhead hoist transfer (OHT) system; and
moving the shelf to the load lock door opening with the first FOUP on the shelf.

11. The method of claim 7 further comprising:
while the first FOUP is in the interior space:
receiving a second FOUP on a shelf of a FOUP elevator system of the FOUP load lock from an overhead hoist transfer (OHT) system; and
moving the shelf to a queueing position with the second FOUP on the shelf.

12. The method of claim 7 further comprising:
using the shuttle, transferring the first FOUP from the interior space through the load lock door opening to a first shelf of a FOUP elevator system of the FOUP load lock;
moving the first shelf, with the first FOUP on the first shelf, to a loading position to provide the first FOUP to an overhead hoist transfer (OHT) system;
moving a second shelf of the FOUP elevator system, with a second FOUP on the second shelf, from a queueing position to the load lock door opening;
using the shuttle, transferring the second FOUP from the second shelf through the load lock door opening to the interior space;
after transferring the second FOUP from the second shelf, moving the second shelf to the loading position;
receiving a third FOUP on the second shelf at the loading position from the OHT system;
moving the second shelf, with the third FOUP on the second shelf, to the queueing position; and
moving the first shelf, without a FOUP on the first shelf, to the load lock door opening, the first shelf without a FOUP thereon being at the load lock door opening while the second shelf with the third FOUP thereon is at the queueing position.

13. The method of claim 12, wherein the first shelf moves at least vertically between the load lock door opening and the loading position, and the second shelf moves at least vertically between the queueing position and the load lock door opening and between the load lock door opening and the loading position.

14. The method of claim 12 further comprising moving the first shelf to a cleared position, the first shelf being in the cleared position when the second shelf is in the loading position.

15. The method of claim 14, wherein:
the first shelf moves at least vertically between the load lock door opening and the loading position;
the first shelf moves at least laterally between the loading position and the cleared position; and
the second shelf moves at least vertically between the queueing position and the load lock door opening and between the load lock door opening and the loading position.

16. A processing system for processing a substrate, the processing system comprising:
a Front Opening Unified Pod (FOUP) load lock being configured to receive a FOUP in an interior space of the FOUP load lock, wherein the FOUP load lock receives the FOUP from outside the processing system with substrates oriented in a horizontal position and maintains the substrates horizontally oriented in the FOUP load lock;
a vacuum system fluidly connected to the interior space of the FOUP load lock, the vacuum system being operable to pump down a pressure of the interior space of the FOUP load lock;
a transfer chamber attached to the FOUP load lock, the transfer chamber comprising a transfer robot, the transfer robot being operable to transfer a substrate from the FOUP in the interior space to the transfer chamber; and
a processing chamber attached to the transfer chamber, the transfer robot being operable to transfer a substrate from the transfer chamber to the processing chamber.

17. The processing system of claim 16, wherein the FOUP load lock comprises:

a load lock isolation door operable to close a load lock isolation door opening in a first sidewall of the FOUP load lock, the load lock isolation door opening being sized so that the FOUP is capable of passing therethrough to and from the interior space; and
a tunnel isolation door operable to close a slit valve opening in a second sidewall of the FOUP load lock, the slit valve opening being sized so that a substrate capable of being placed in the FOUP is capable of passing through the slit valve opening to and from the interior space, the transfer robot being operable to transfer a substrate from the transfer chamber to the processing chamber via the slit valve opening.

18. The processing system of claim 16, wherein the FOUP load lock further comprises:
a FOUP elevator system comprising a first shelf and a second shelf moveable along a track, wherein:
the first shelf and the second shelf are moveable along the track to a loading position to receive or provide a FOUP;
the first shelf and the second shelf are moveable along the track to a load lock transfer position to transfer a FOUP to or from the interior space;
the first shelf is movable along the track to a cleared position when the second shelf is at the loading position; and
the second shelf is moveable along the track to a queueing position when the first shelf is at the load lock transfer position.

19. The processing system of claim 16, wherein the FOUP load lock further comprises:
a shuttle comprising a clamp, a lateral extender, and a vertical lift, the shuttle being operable to attach to the FOUP using the clamp and to move the FOUP through a load lock door opening of the FOUP load lock and within the interior space using the lateral extender and the vertical lift, the shuttle further being operable to position the FOUP at a sidewall of the FOUP load lock for access to a substrate in the FOUP by the transfer robot.

20. The processing system of claim 16, wherein the FOUP load lock further comprises:
a FOUP door opener operable to engage a FOUP door and remove the FOUP door from the FOUP.

* * * * *